United States Patent
Mori (10) Patent No.: US 9,985,195 B2
(45) Date of Patent: May 29, 2018

(54) PIEZOELECTRIC ACTUATOR, PIEZOELECTRIC VIBRATION DEVICE, AND PORTABLE TERMINAL

(71) Applicant: KYOCERA Corporation, Kyoto-shi, Kyoto (JP)

(72) Inventor: Hiroshi Mori, Kirishima (JP)

(73) Assignee: KYOCERA Corporation, Kyoto-Shi, Kyoto (JP)

(*) Notice: Subject to any disclaimer, the term of this patent is extended or adjusted under 35 U.S.C. 154(b) by 619 days.

(21) Appl. No.: 14/408,618

(22) PCT Filed: Oct. 31, 2013

(86) PCT No.: PCT/JP2013/079532
§ 371 (c)(1),
(2) Date: Dec. 17, 2014

(87) PCT Pub. No.: WO2014/083998
PCT Pub. Date: Jun. 5, 2014

(65) Prior Publication Data
US 2015/0155470 A1  Jun. 4, 2015

(30) Foreign Application Priority Data

Nov. 30, 2012 (JP) .................. 2012-262561

(51) Int. Cl.
*H01L 41/09* (2006.01)
*H01L 41/053* (2006.01)
(Continued)

(52) U.S. Cl.
CPC ........ *H01L 41/0533* (2013.01); *B06B 1/0603* (2013.01); *B06B 1/0611* (2013.01);
(Continued)

(58) Field of Classification Search
CPC ............. H01L 41/0533; H01L 41/0475; H01L 41/083; H01L 41/0973
(Continued)

(56) References Cited

U.S. PATENT DOCUMENTS 8,521,239 B2* 8/2013 Hosoi ................ G02C 11/06
455/575.1
2012/0000554 A1* 1/2012 Mcintyre ............ F16K 31/0696
137/561 R
(Continued)

FOREIGN PATENT DOCUMENTS

| CN | 102327128 A | 1/2012 |
| JP | 6-014396 A | 1/1994 |

(Continued)

OTHER PUBLICATIONS

Chinese Office Action with English concise explanation, Chinese Patent Application No. 201380029255.4, Nov. 14, 2016, 7 pgs.
(Continued)

*Primary Examiner* — Thomas Dougherty
*Assistant Examiner* — Karen B Addison
(74) *Attorney, Agent, or Firm* — Volpe and Koenig, P.C.

(57) ABSTRACT

A piezoelectric actuator which is capable of reduction of noise resulting from vibration of a piezoelectric element, a piezoelectric vibration device, and a portable terminal are provided. A piezoelectric actuator includes a piezoelectric element including a stacked body composed of internal electrodes and piezoelectric layers which are laminated, and a surface electrode disposed on one of main surfaces of the stacked body so as to be electrically connected to the internal electrodes; a flexible substrate electrically connected to the surface electrode; and a shock-absorbing material disposed on the flexible substrate. The shock-absorbing material, at
(Continued)

least partly, is disposed on a first region of the flexible substrate which overlaps with the piezoelectric element.

17 Claims, 6 Drawing Sheets

(51) Int. Cl.
| | |
|---|---|
| *G06F 3/01* | (2006.01) |
| *H01L 41/047* | (2006.01) |
| *H01L 41/29* | (2013.01) |
| *B06B 1/06* | (2006.01) |
| *H04M 1/02* | (2006.01) |
| *G10K 9/122* | (2006.01) |
| *H01L 41/083* | (2006.01) |

(52) U.S. Cl.
CPC ............ *B06B 1/0681* (2013.01); *G06F 3/016* (2013.01); *G10K 9/122* (2013.01); *H01L 41/0472* (2013.01); *H01L 41/0475* (2013.01); *H01L 41/09* (2013.01); *H01L 41/0973* (2013.01); *H01L 41/29* (2013.01); *H04M 1/026* (2013.01); *H01L 41/083* (2013.01); *H04M 2250/12* (2013.01)

(58) Field of Classification Search
USPC .................................. 310/328, 326, 365–367
See application file for complete search history.

(56) References Cited

U.S. PATENT DOCUMENTS

| | | |
|---|---|---|
| 2012/0004554 A1 | 1/2012 | Aoki et al. |
| 2012/0289162 A1* | 11/2012 | Hosoi .................. H04R 25/606 |
| | | 455/41.3 |

FOREIGN PATENT DOCUMENTS

| | | | |
|---|---|---|---|
| JP | 2002-010393 A | | 1/2002 |
| JP | 2007-264095 A | | 10/2007 |
| JP | 2007264095 | * | 10/2007 |
| JP | 2012-015680 A | | 1/2012 |
| JP | 2012015680 | * | 1/2012 |
| JP | 2012-138770 A | | 7/2012 |

OTHER PUBLICATIONS

International Search Report, PCT/JP2013/079532, dated Dec. 16, 2013, 2 pgs.

* cited by examiner

PIEZOELECTRIC ACTUATOR, PIEZOELECTRIC VIBRATION DEVICE, AND PORTABLE TERMINAL

BACKGROUND OF THE INVENTION

The present invention relates to a piezoelectric actuator which is suitable for use in a piezoelectric vibration device and a portable terminal, a piezoelectric vibration device, and a portable terminal.

As piezoelectric actuators, there are known a construction employing a bimorph-type piezoelectric element obtained by forming a surface electrode on a surface of a stacked body composed of internal electrodes and piezoelectric layers which are laminated (refer to Japanese Unexamined Patent Publication JP-A 2002-10393), and a construction in which a piezoelectric element and a flexible substrate are joined to each other by an electrically-conductive connecting member, so that a surface electrode of the piezoelectric element and a wiring conductor of the flexible substrate are electrically connected to each other (refer to Japanese Unexamined Patent Publication JP-A 6-14396 (1994).

BRIEF SUMMARY OF THE INVENTION

A flexible substrate is generally obtained by disposing a wiring conductor on a base film made of polyimide or the like. Since a resin such as polyimide used for the base film is an elastic material, it follows that vibration of a piezoelectric element is easily transmitted to the flexible substrate. Therefore, as a problem that exists in a conventional piezoelectric actuator, vibration of a piezoelectric element is transmitted even to a junction between a flexible substrate and an external circuit (connector junction) which is opposite to a junction between the flexible substrate and the piezoelectric element, and, the vibration is detected as noise.

Furthermore, a piezoelectric vibration device and a portable terminal which are equipped with the above-described piezoelectric actuator may suffer from quality degradation due to noise resulting from vibration of the piezoelectric element.

The invention has been devised in view of circumstances as mentioned supra, and accordingly an object thereof is to provide a piezoelectric actuator which is capable of reduction of noise resulting from vibration of a piezoelectric element, a piezoelectric vibration device, and a portable terminal.

The invention provides a piezoelectric actuator comprising: a piezoelectric element comprising a stacked body composed of internal electrodes and piezoelectric layers which are laminated, and a surface electrode disposed on one of main surfaces of the stacked body so as to be electrically connected to the internal electrodes; a flexible substrate electrically connected to the surface electrode; and a shock-absorbing material disposed on the flexible substrate, the shock-absorbing material, at least partly, being disposed on a first region of the flexible substrate which overlaps with the piezoelectric element.

Moreover, the invention provides a piezoelectric vibration device comprising: the above-described piezoelectric actuator; and a vibrating plate joined to the other main surface of the piezoelectric element.

Further, the invention provides a portable terminal comprising: the above-described piezoelectric actuator; an electronic circuit; a display; and a housing, the other main surface of the piezoelectric actuator being joined to the display or the housing.

According to the piezoelectric actuator of the invention, with the provision of the shock-absorbing material which absorbs vibration from the piezoelectric element, the vibration from the piezoelectric element is attenuated and is thus less prone to be transmitted to a connector junction, wherefore noise reduction can be achieved.

Moreover, the piezoelectric vibration device and the portable terminal which are equipped with the above-described piezoelectric actuator can be maintained in a high-quality condition due to reduction of noise resulting from vibration from the piezoelectric element.

BRIEF DESCRIPTION OF THE SEVERAL VIEWS OF THE DRAWINGS

FIG. 1(a) is a schematic perspective view showing an example of a piezoelectric actuator according to an embodiment of the invention, and FIG. 1(b) is a schematic sectional view taken along the line A-A shown in FIG. 1(a);

DETAILED DESCRIPTION OF THE INVENTION

An example of a piezoelectric actuator according to an embodiment of the invention will be described in detail with reference to drawings.

FIG. 1(a) is a schematic perspective view showing an example of a piezoelectric actuator according to an embodiment of the invention, and FIG. 1(b) is a schematic sectional view taken along the line A-A shown in FIG. 1(a).

Figures 1, 2:
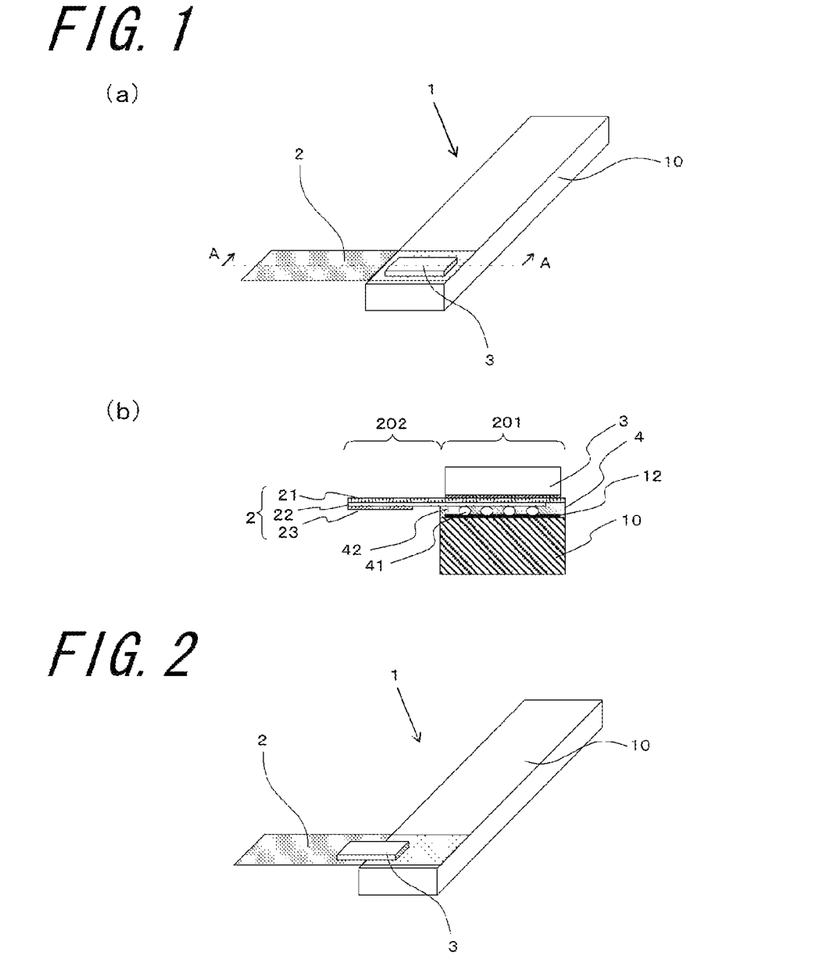
FIG. 2 is a schematic perspective view showing another example of the piezoelectric actuator according to the embodiment of the invention.

A piezoelectric actuator 1 of the present embodiment as shown in FIG. 1 comprises: a piezoelectric element 10 comprising a stacked body 11 composed of internal electrodes and piezoelectric layers which are laminated, and a surface electrode 12 disposed on one of main surfaces of the stacked body 11 so as to be electrically connected to the internal electrode; a flexible substrate 2 electrically connected to the surface electrode 12; and a shock-absorbing material 3 disposed on the flexible substrate 2. The shock-absorbing material 3, at least partly, is disposed on a first region 201 of the flexible substrate 2 which overlaps with the piezoelectric element 10.

The piezoelectric actuator 1 of this example includes the piezoelectric element 10, and, the stacked body 11 constituting the piezoelectric element 10 is configured by laminating internal electrodes and piezoelectric layers together in plate form. The stacked body 11 has an active section in which a plurality of internal electrodes are arranged so as to overlap with each other in a stacking direction thereof, and an inactive section which is a part other than the active section, and is given an elongated form, for example. In a case where the piezoelectric actuator is attached to a display or housing of a portable terminal, the length of the stacked body 11 falls preferably in the range of, for example, 18 mm to 28 mm, and more preferably in the range of 22 mm to 25 mm. The width of the stacked body 11 falls preferably in the range of, for example, 1 mm to 6 mm, and more preferably in the range of 3 mm to 4 mm. The thickness of the stacked body 11 falls preferably in the range of, for example, 0.2 mm to 1.0 mm, and more preferably in the range of 0.4 mm to 0.8 mm.

The internal electrodes constituting the stacked body 11, which are formed through co-firing with ceramics used to form the piezoelectric layer, is composed of a first electrode and a second electrode. For example, the first electrode serves as a ground electrode, and the second electrode serves as a positive or negative electrode. The internal electrodes and the piezoelectric layers are alternately laminated in such a manner that one piezoelectric layer is sandwiched between the internal electrodes in a vertical direction thereof, and more specifically the first electrode and the second electrode are arranged in a stacking order, so that a driving voltage is applied to the piezoelectric layer sandwiched between them. As the constituent material, for example, a conductor composed predominantly of silver or a silver-palladium alloy whose reactivity with piezoelectric ceramics is low, or a conductor containing copper, platinum, or the like can be used, or alternatively, a material containing a ceramic component or glass component in the aforementioned conductor can also be used.

Although not shown in the drawing, ends of the first electrode and the second electrode are alternately led out to the paired and opposed side surfaces of the stacked body 11. In a case where the piezoelectric actuator is attached to a display or housing of a portable terminal, the length of the internal electrode falls preferably in the range of, for example, 17 mm to 25 mm, and more preferably in the range of 21 mm to 24 mm. The width of the internal electrode falls preferably in the range of, for example, 1 mm to 5 mm, and more preferably in the range of 2 mm to 4 mm. The thickness of the internal electrode falls preferably in the range of, for example, 0.1 to 5 μm.

The piezoelectric layer constituting the stacked body 11 is made of ceramics having piezoelectric properties, and, as such ceramics, for example, a perovskite-type oxide made of lead zirconate titanate ($PbZrO_3$—$PbTiO_3$), lithium niobate ($LiNbO_3$), or lithium tantalate ($LiTaO_3$) can be used. For the sake of effecting driving under low-voltage conditions, the single-layer thickness of the piezoelectric layer is preferably adjusted to fall in the range of 0.01 mm to 0.1 mm, for example. Moreover, for the sake of acquiring large flexural vibration, it is desirable to impart a piezoelectric constant d31 of greater than or equal to 200 pm/V.

On one main surface of the stacked body 11 is disposed the surface electrode 12 electrically connected to the internal electrodes. Although not shown in the drawing, the surface electrode 12 is composed of, for example, a first surface electrode having a large area, and a second surface electrode and a third surface electrode each having a small area. The first surface electrode is electrically connected to an internal electrode which serves as the first electrode, the second surface electrode is electrically connected to an internal electrode which serves as the second electrode placed on the one-main-surface side, and the third surface electrode is electrically connected to an internal electrode which serves as the second electrode placed on the other-main-surface side. In a case where the piezoelectric actuator is attached to a display or housing of a portable terminal, the length of the first surface electrode falls preferably in the range of, for example, 17 mm to 23 mm, and more preferably in the range of 19 mm to 21 mm. The width of the first surface electrode falls preferably in the range of, for example, 1 mm to 5 mm, and more preferably in the range of 2 mm to 4 mm. The length of each of the second surface electrode and the third surface electrode falls preferably in the range of 1 mm to 3 mm, for example. The width of each of the second surface electrode and the third surface electrode falls preferably in the range of 0.5 mm to 1.5 mm, for example.

Moreover, the piezoelectric actuator 1 of this example includes the flexible substrate 2, and the flexible substrate 2 is electrically connected to the surface electrode 12 of the piezoelectric element 10.

Specifically, the flexible substrate 2 is, for example, a flexible printed wiring board in which two wiring conductors 22 are disposed on a main surface of a resin-made base film 21 facing the piezoelectric element 10, and, the wiring conductors 22 are electrically connected to the surface electrode 12 through an electrically-conductive joining member 4. Note that a cover film 23 may be disposed so as to cover part of the wiring conductors 22, and, in this case, reliable electrical connection can be established by avoiding placement of the cover film 23 on the first region 201 and nearby locations. The flexible substrate 2 is joined at its one end to the piezoelectric element 10, and is joined at its another end (connector junction) to a connector 5.

While an electrically-conductive adhesive, solder, or the like can be used as the electrically-conductive joining member 4, an electrically-conductive adhesive is desirable for use. This is because, in the case of using an electrically-conductive adhesive prepared by dispersing conductor particles made of gold, copper, nickel, or gold-plated resin balls in a resin such for example as acrylic resin, epoxy resin, silicone resin, polyurethane resin, or synthetic rubber, as compared with the case of using solder, vibration-induced stress can be reduced to a greater extent. Among various electrically-conductive adhesives, an anisotropic conductive material is more desirable for use. The anisotropic conductive material is composed of conductive particles 41 responsible for electrical connection and a resin adhesive 42 responsible for adhesion. Specifically, one conductive particle 41 makes contact with the surface electrode 12 and the wiring conductor 22. That is, it is preferable that the conductive particles situated between the surface electrode 12 and the wiring conductor 22 are each kept in contact with the surface electrode 12 and the wiring conductor 22. The anisotropic conductive material, being capable of conduction in a thickness direction and capable of insulation in an in-plane direction, is free from electrical short-circuiting between surface electrodes of different polarities even during narrow-pitch wiring installation, and is thus conducive to making the part of connection with the flexible substrate 2 compact.

The shock-absorbing material 3 is disposed on the flexible substrate 2, and the shock-absorbing material 3, at least partly, is disposed on the first region 20 of the flexible substrate 2 which overlaps with the piezoelectric element 10.

The shock-absorbing material 3 is made of, for example, a resin such as a glass epoxy (FR-4), a composite (CEM-3), polyetherimide, polyimide, or polyester, or a metal such as stainless steel, aluminum, or an alloy of them, and is designed to have a thickness of 50 to 200 µm.

Since the shock-absorbing material 3 absorbs vibration from the piezoelectric element 10, it follows that the vibration from the piezoelectric element 10 is attenuated and is thus less prone to be transmitted to the connector junction for connection between the flexible substrate 2 and an external circuit, wherefore noise reduction is achieved.

Also, the strength of the joining surface of the flexible substrate 2 to the piezoelectric element 10 (the strength of the pressure-bonded surface) is increased with consequent improvement in adherability under pressure. Furthermore, the provision of the shock-absorbing material 3 makes it possible to slacken heat conduction and thereby enhance joinability. In addition, the provision of the shock-absorbing material 3 makes it possible to alleviate localized stress concentration on the piezoelectric element 10 in the manufacturing process, for example, and thereby suppress chipping and cracking of the piezoelectric element 10.

Figure 7:
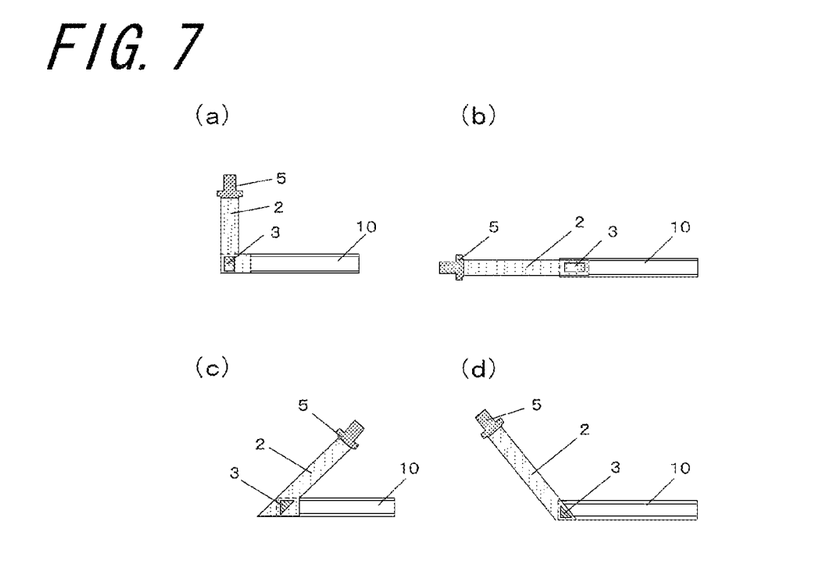
FIG. 7(a) to FIG. 7(d) are schematic plan views showing form variations of the piezoelectric actuator shown in FIG. 1.

It is noted that the flexible substrate 2 and the shock-absorbing material 3 are not limited to those as shown in FIG. 1 in respect of shape and arrangement, and therefore, for example, a number of form variations as shown in FIG. 7(*a*) to FIG. 7(*d*) can be adopted instead. FIG. 7(*a*) to FIG. 7(*d*) show flexible substrates 2 of different forms, wherein the shock-absorbing material 3 is placed within the first region 201 of the flexible substrate 2 which overlaps with the piezoelectric element 10.

Figure 8:
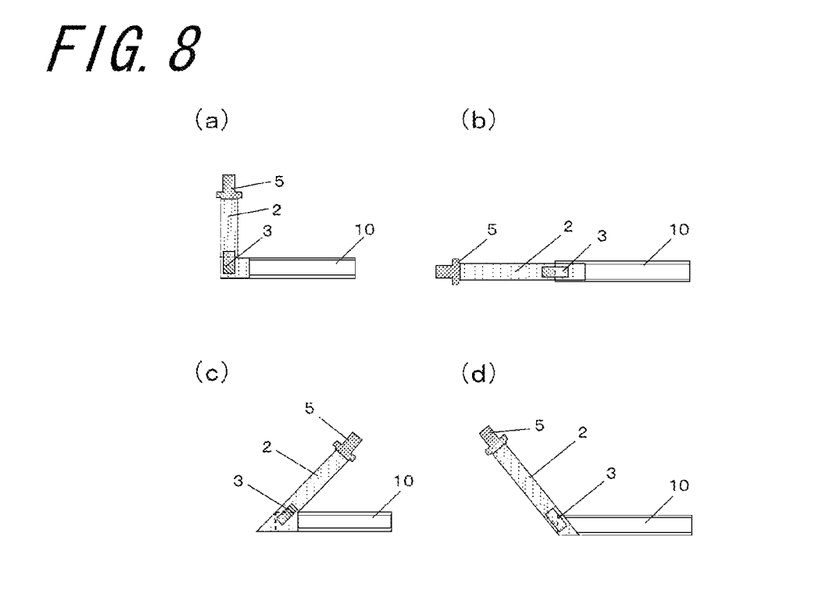
FIG. 8(a) to FIG. 8(d) are schematic plan views showing form variations of the piezoelectric actuator shown in FIG. 2.

It is preferable that, as shown in FIG. 2, the shock-absorbing material 3 is disposed so as to straddle the boundary of the first region 201 which overlaps with the piezoelectric element 10 and a second region 202 which is a region of the flexible substrate 2 situated so as to extend from the piezoelectric element 10 and does not overlap with the piezoelectric element 10. As employed herein, the region of the flexible substrate 2 situated so as to extend from the piezoelectric element 10 (second region 202) refers to a region of the flexible substrate 2 that extends along a direction in which the wiring conductor 22 extends. By disposing the shock-absorbing material 3 so as to straddle the boundary of the first region 201 serving as a path for transmission of vibration of the piezoelectric element 10 and the second region 202, it is possible to attain even more effective arrangement and thereby achieve further noise reduction. This also makes it possible to restrain the flexible substrate 2 from bending and thereby suppress noise and break resulting from substrate bending.

Where the shapes and the arrangement of the flexible substrate 2 and the shock-absorbing material 3 are concerned, in addition to the form shown in FIG. 2, for example, a number of form variations as shown in FIG. 8(*a*) to FIG. 8(*d*) can be adopted. FIG. 8(*a*) to FIG. 8(*d*) show flexible substrates 2 of different forms, wherein the shock-absorbing material 3 is disposed so as to straddle the boundary of the first region 201 of the flexible substrate 2 which overlaps with the piezoelectric element 10 and the second region 202 which does not overlap with the piezoelectric element 10.

Figure 3:
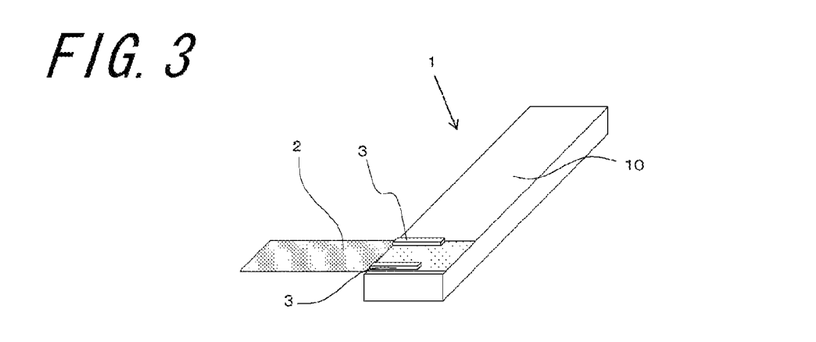
FIG. 3 is a schematic perspective view showing another example of the piezoelectric actuator according to the embodiment of the invention.

Moreover, as shown in FIG. 3, a pair of shock-absorbing materials 3 may be provided, and, in this case, it is advisable that each of the shock-absorbing materials 3, at least partly, is disposed on a part of the first region 201 which lies in close proximity to both end portions of the boundary of the first region 201 and a second region 202 which is a region of the flexible substrate 2 situated so as to extend from the piezoelectric element 10 and does not overlap with the piezoelectric element 10. As employed herein, the region of the flexible substrate 2 situated so as to extend from the piezoelectric element 10 (second region 202) refers to a region of the flexible substrate 2 that extends along a direction in which the wiring conductor 22 extends. In this case, it is possible to suppress distortion of the flexible substrate 2 and thereby suppress noise and break resulting from substrate distortion.

Figure 4:
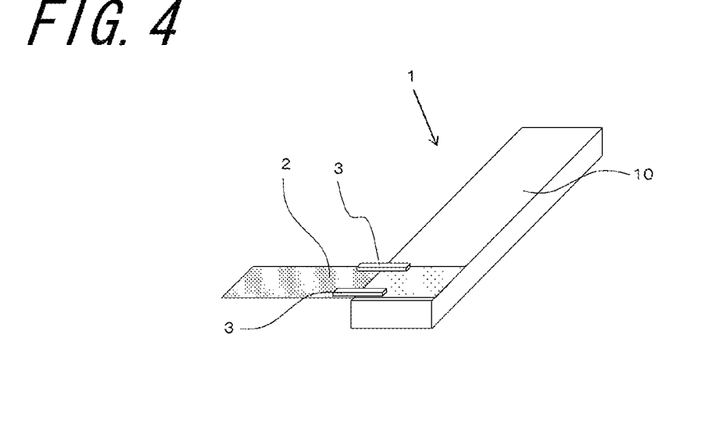
FIG. 4 is a schematic perspective view showing another example of the piezoelectric actuator according to the embodiment of the invention.
Figure 9:
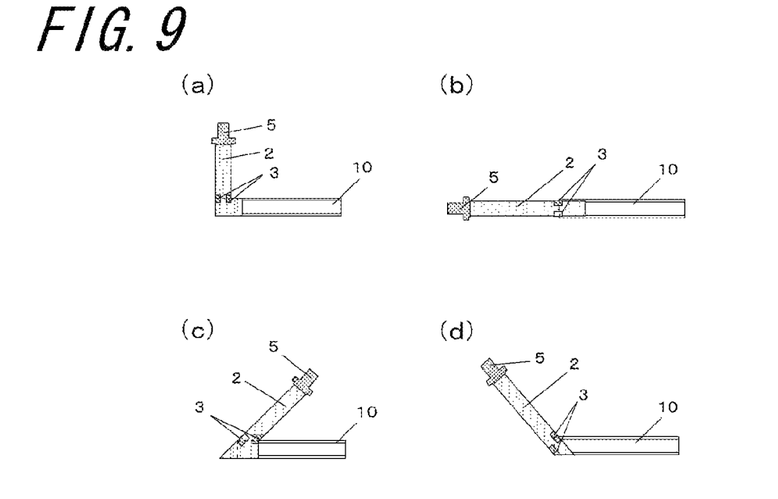
FIG. 9(a) to FIG. 9(d) are schematic plan views showing form variations of the piezoelectric actuator shown in FIG. 4.

Furthermore, as shown in FIG. 4, a pair of shock-absorbing materials 3 may be provided, and, in this case, it is preferable that the pair of the shock-absorbing materials 3 is disposed so as to straddle both end portions of the boundary of the first region 201 and the second region 202, respectively. As employed herein, "the boundary" refers to the boundary of a main extending region of the flexible substrate 2 as above described and the first region 201. In this case, it is possible to restrain the flexible substrate 2 from bending and being distorted and thereby achieve further suppression of noise and break.

Where the shapes and the arrangement of the flexible substrate 2 and the shock-absorbing material 3 are concerned, in addition to the form shown in FIG. 4, for example, a number of form variations as shown in FIG. 9(*a*) to FIG. 9(*d*) can be adopted. FIG. 9(*a*) to FIG. 9(*d*) show flexible substrates 2 of different forms, wherein a pair of shock-absorbing materials 3 is disposed so that the pair of the shock-absorbing materials 3 is disposed so as to straddle both ends of the boundary of the first region 201 and the second region 202, respectively.

Figure 5:
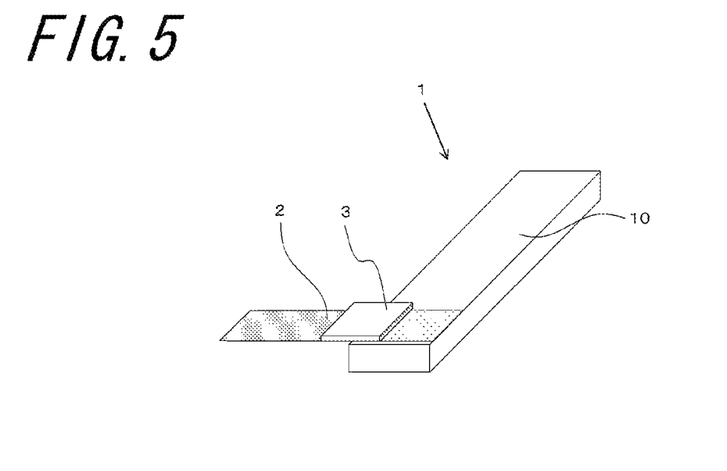
FIG. 5 is a schematic perspective view showing another example of the piezoelectric actuator according to the embodiment of the invention.
Figure 6:
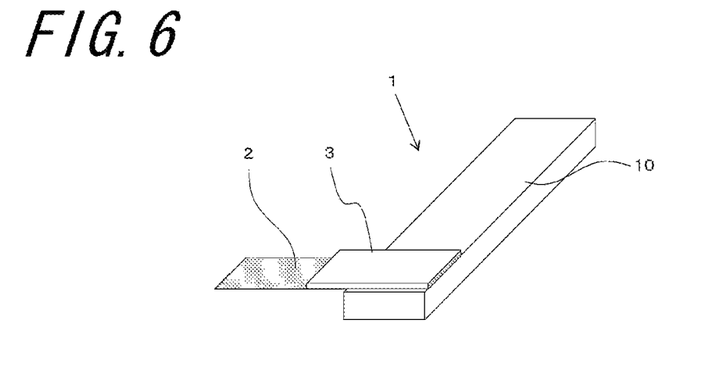
FIG. 6 is a schematic perspective view showing another example of the piezoelectric actuator according to the embodiment of the invention.
Figure 10:
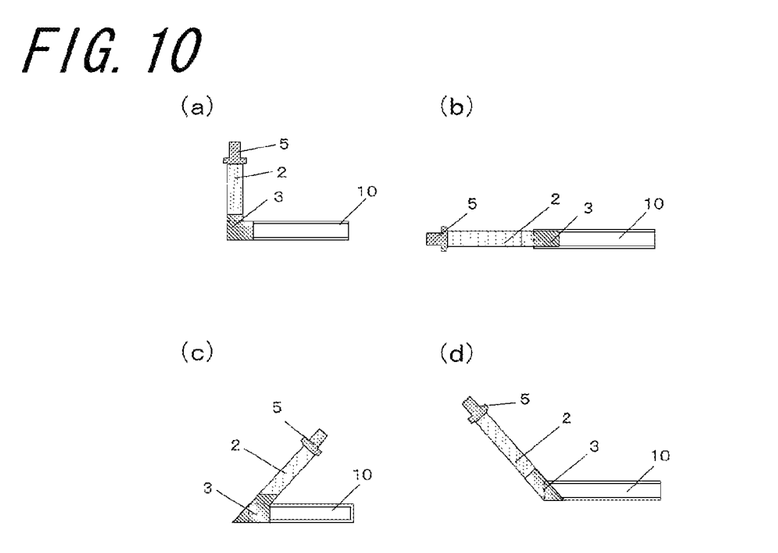
FIG. 10(a) to FIG. 10(d) are schematic plan views showing form variations of the piezoelectric actuator shown in FIG. 6.

Moreover, as shown in FIG. 5, it is preferable that the shock-absorbing material 3 is disposed so as to straddle the entire area of the boundary of the first region 201 and the second region 202, and also, as shown in FIG. 6, it is preferable that the shock-absorbing material 3 is disposed so as to lie over the entire area of the first region 201 while straddling the entire area of the boundary of the first region 201 and the second region 202. In this case, since the shock-absorbing material is disposed so as to cover all of the parts that receive vibration of the piezoelectric element 10 (the entire boundary serving as the path for transmission of vibration), further noise suppression is achieved.

Where the shapes and the arrangement of the flexible substrate 2 and the shock-absorbing material 3 are concerned, in addition to the form shown in FIG. 6, for example, a number of form variations as shown in FIG. 10(*a*) to FIG. 10(*d*) can be adopted. FIG. 10(*a*) to FIG. 10(*d*) show flexible substrates 2 of different forms, wherein the shock-absorbing material 3 is disposed so as to lie over the entire area of the first region 201 while straddling the entire area of the boundary of the first region 201 and the second region 202.

Figure 11:
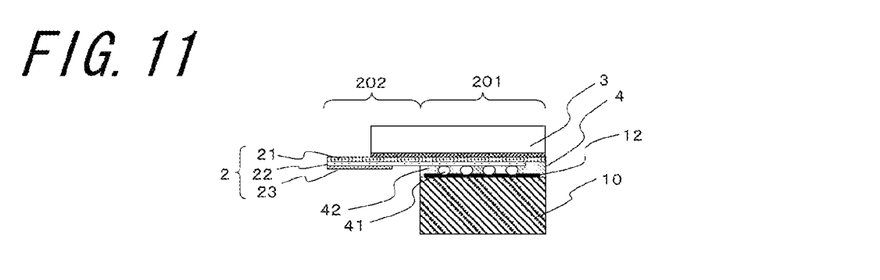
FIG. 11 is a schematic sectional view showing another example of the piezoelectric actuator according to the embodiment of the invention.

Moreover, as shown in FIG. 11, the flexible substrate 2 includes the base film 21, the wiring conductor 22 disposed on the main surface of the base film 21 facing the piezoelectric element 10, and the cover film 23 disposed so as to cover part of the wiring conductor 22, and the cover film 23 is not disposed on the first region 201 and nearby locations. It is preferable that the shock-absorbing material 3 overlaps with the cover film 23 so that the overlapping area measures in the range of 0.5 to 1 mm, for example. According to this construction, it never occurs that the wiring conductor 22 left exposed is bent at a sharp angle, wherefore resistance to a break can be obtained.

Moreover, it is preferable that the base film 21 and the shock-absorbing material 3 are made of the same material. For example, in a case where the base film 21 and the shock-absorbing material 3 are made of polyimide, since they have the same thermal expansion coefficient, it follows that the shock-absorbing material 3 can be less prone to being separated from the base film 21.

Moreover, it is preferable that the shock-absorbing material 3 is greater in thickness than the flexible substrate 2. In this case, the vibration suppressing effect is enhanced, wherefore noise elimination is achieved.

Moreover, it is preferable that the shock-absorbing material 3 is bonded to the upper surface of the flexible substrate 2 via a resin-based adhesive such as an epoxy-based, silicone-based, or acrylic resin-based adhesive. In this case, even the resin-based adhesive suppresses vibration, wherefore noise elimination is achieved.

By designing the piezoelectric element 10 to have a flat other main surface, for example, in a case where the other main surface is bonded to an object for application of vibration (for example, a vibrating plate as will hereafter be described), it is possible to readily cause the piezoelectric element 10 to flexurally vibrate unitarily with the object for application of vibration, and thereby raise the efficiency of flexural vibration in the construction as a whole.

While the piezoelectric actuator 1 shown in FIG. 1 is a so-called bimorph-type piezoelectric actuator which is flexurally vibrated so that one main surface and the other main surface thereof are each bent into a curved surface upon the input of an electric signal from the surface electrode 12, the piezoelectric actuator of the invention is not limited to the bimorph-type, but may be of a unimorph-type, and, in this case, the unimorph-type piezoelectric actuator can be flexurally vibrated by joining the other main surface of the piezoelectric actuator to a vibrating plate which will hereafter be described, for example.

Next, a method of manufacturing the piezoelectric actuator 1 of the present embodiment will be described.

First, ceramic green sheets for forming the piezoelectric layers are prepared. Specifically, calcined powder of piezoelectric ceramics, a binder made of an organic high polymer such as acrylic-based polymer or butyral-based polymer, and a plasticizer are mixed to prepare a ceramic slurry. The ceramic slurry is shaped into ceramic green sheets by a tape molding technique such as the doctor blade method or the calender roll method. The piezoelectric ceramics may be of any given type so long as it has piezoelectric properties, and, for example, a perovskite-type oxide made of lead zirconate titanate ($PbZrO_3$—$PbTiO_3$) can be used. Moreover, as the plasticizer, dibutyl phthalate (DBP), dioctyl phthalate (DOP), or the like can be used.

Next, an electrically-conductive paste for forming the internal electrode is formed. Specifically, the electrically-conductive paste is prepared by admixing a binder and a plasticizer in metal powder of a silver-palladium alloy. This electrically-conductive paste is applied, in a pattern of the internal electrode, onto the above-described ceramic green sheet by screen printing technique. Then, a plurality of the ceramic green sheets with the printed electrically-conductive paste are laminated on top of each other, and, the laminate is subjected to debinding, or binder removal treatment at a predetermined temperature, is fired at a temperature of 900 to 1200° C., and is ground into a predetermined shape by means of a surface grinder or otherwise, whereby a stacked body 11 composed of internal electrodes and piezoelectric layers which are alternately laminated can be produced.

It is noted that the method of producing the stacked body 11 is not limited to the method thus far described, and the stacked body 11 can therefore be produced by any given manufacturing method so long as it allows production of a stacked body 11 composed of a plurality of internal electrodes and piezoelectric layers which are laminated.

After that, the surface electrode 12 is formed by printing an electrically-conductive paste containing silver glass, which is prepared by adding a binder, a plasticizer, and a solvent to a mixture of glass and conductive particles composed predominantly of silver, to the main and side surfaces of the stacked body 11 in a pattern of the surface electrode 12 by means of screen printing or otherwise, performing drying process, and performing baking process at a temperature of 650 to 750° C.

It is noted that, when the surface electrode 12 and the internal electrode are electrically connected to each other, the electrical connection may be established by forming a via conductor passing through the piezoelectric layer, or by forming a side electrode on the side surface of the stacked body 11; that is, the surface electrode 12 may be produced by any given manufacturing method.

Next, the flexible substrate 2 and the shock-absorbing material 3 are prepared. For example, a polyimide sheet formed into a predetermined shape with a thickness of, for example, 125 μm in advance (a segmentable sheet for forming shock-absorbing materials) is stuck to a predetermined position of the surface of a wiring conductor 22-free side of a sheet bearing an arrangement of a large number of flexible substrates 2 (base films 21) (a segmentable sheet for forming base films) with a thermosetting resin adhesive. Then, at the time of separating the flexible substrates 2 from the sheet (obtaining separate flexible substrate segments) with a die or the like, concurrently, the shock-absorbing material 3 is worked into a final shape.

Under certain circumstances, there is a need to stick the shock-absorbing material 3 previously formed into a final shape to a predetermined position in the first place. For example, in order to implement the structures shown in FIG. 1 to FIG. 4, it is advisable to stick the shock-absorbing material 3 formed into a predetermined shape with a die or the like to a predetermined position of the flexible substrate 2. On the other hand, for example, in order to implement the structures shown in FIG. 5 and FIG. 6, since the shock-absorbing material 3 can be subjected to shaping process at the time of separation of the flexible substrates 2 from the flexible-substrate segmentable sheet, it is advisable that a plurality of shock-absorbing materials 3 are stuck to each other as a single component, and then the process for shaping the shock-absorbing material 3 is performed concurrently with the separation of the flexible substrates 2.

Next, the flexible substrate 2 is fixedly connected (joined) to the piezoelectric element 10 with an electrically-conductive adhesive.

First, an electrically-conductive adhesive paste is applied to a predetermined position of the piezoelectric element 10 by means of screen printing or otherwise. After that, with the piezoelectric element 10 kept in contact with the flexible substrate 2, the electrically-conductive adhesive paste is cured, whereupon the flexible substrate 2 is fixedly connected to the piezoelectric element 10. It is noted that the electrically-conductive adhesive paste may be applied to the flexible substrate 2 side.

In a case where a resin constituting the electrically-conductive adhesive is a thermoplastic resin, following the completion of application of the electrically-conductive adhesive to a predetermined position of the piezoelectric element 10 or the flexible substrate 2, the piezoelectric element 10 and the flexible substrate 2 in a condition of making contact with each other via the electrically-conductive adhesive are heated and pressurized, whereupon the thermoplastic resin is softened and fluidized, and whereafter the thermoplastic resin is cured once again upon reaching room temperature, so that the flexible substrate 2 is fixedly connected to the piezoelectric element 10.

Especially when an anisotropic conductive member is used for the electrically-conductive joining member 4, there is a need to exercise pressurization-amount control in such a manner that adjacent conductive particles does not make contact with each other.

Moreover, although the above description deals with the method of applying the electrically-conductive adhesive to the piezoelectric element 10 or the flexible substrate 2, alternatively, the piezoelectric element 10 and the flexible substrate 2 may be joined to each other, with an electrically-conductive adhesive formed into a sheet shape in advance interposed between them, under the application of heat and pressure.

Figure 12:
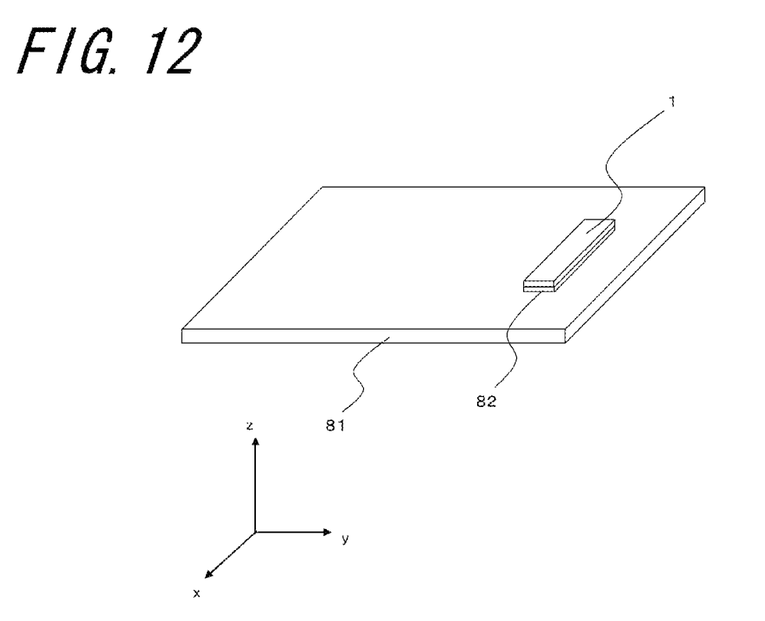
FIG. 12 is a schematic perspective view schematically showing a piezoelectric vibration device according to an embodiment of the invention.

As shown in FIG. 12, a piezoelectric vibration device of the invention comprises: the piezoelectric actuator 1; and a vibrating plate 81 joined to the other main surface of the piezoelectric actuator 1.

The vibrating plate 81 has a rectangular thin plate shape. The vibrating plate 81 can be formed with preferred use of a material having high rigidity and great elasticity such as acrylic resin or glass. Moreover, a thickness of the vibrating plate 81 is set to 0.4 mm to 1.5 mm, for example.

The vibrating plate 81 is joined, through a joining member 82, to the other main surface of the piezoelectric actuator 1. The other main surface may either be entirely joined or substantially entirely joined to the vibrating plate 81 through the joining member 82.

The joining member 82 is deformable. That is, the joining member 82 is deformable when the vibrating plate 81 is vibrated by driving the piezoelectric actuator 1, and, given that the joining member 82 and the vibrating plate 81 are subjected to the same force, then the joining member 82 becomes deformed more greatly than the vibrating plate 81. Such a joining member 82 is shaped like a film, for example. Moreover, the joining member 82 is made of a material which is softer and becomes deformed more easily than the vibrating plate 81, and is thus smaller than the vibrating plate 81 in respect of coefficient of elasticity and rigidity, such as Young's modulus, modulus of rigidity, and modulus of volume elasticity. The other main surface (the main surface pointing in the −z direction in the drawing) of the piezoelectric actuator 1 is entirely fixed to one main surface (the main surface pointing in the +z direction in the drawing) of the joining member 82, and part of one main surface (the main surface pointing in the +z direction in the drawing) of the vibrating plate 81 is fixed to the other main surface (the main surface pointing in the −z direction in the drawing) of the joining member 82.

In the case of joining the piezoelectric actuator 1 and the vibrating plate 81 by the deformable joining member 82, upon transmission of vibration from the piezoelectric actuator 1, the deformable joining member 82 becomes deformed more greatly than the vibrating plate 81.

At this time, vibration in reverse phase reflected from the vibrating plate 81 can be alleviated by the deformable joining member 82, wherefore the piezoelectric actuator 1 is capable of transmitting strong vibration to the vibrating plate 81 without incurring the influence of ambient vibration.

Particularly, it is preferable that the joining member 82, at least partly, is made of a viscoelastic body in that, while strong vibration from the piezoelectric actuator 1 can be transmitted to the vibrating plate 81, weak vibration reflected from the vibrating plate 81 can be absorbed by the joining member 82. For example, it is possible to use a double-faced tape formed by applying an adhesive to both sides of a base material made of a nonwoven fabric or the like, or a joining member composed of an adhesive having elasticity, each of which has a thickness of 10 μm to 2000 μm, for example.

The joining member 82 may either be of a one-piece member or of a composite body consisting of several members. As such a joining member 82, for example, a double-faced tape formed by applying an adhesive to both sides of a base material made of a nonwoven fabric or the like, or a variety of elastic adhesives that are adhesives having elasticity can be preferably used. Moreover, although the thickness of the joining member 82 should preferably be greater than the amplitude of flexural vibration of the piezoelectric actuator 1, too large a thickness will cause attenuation of vibration, wherefore the thickness is set to fall in the range of 0.1 mm to 0.6 mm, for example. However, in the piezoelectric vibration device of the invention, there is no particular limitation to the material used for the joining member 82, wherefore the joining member 82 may be made of a material which is harder and less deformable than the vibrating plate 81. Moreover, under certain circumstances, the joining member 82 may be omitted from the construction.

The thusly constructed piezoelectric vibration device of the present embodiment functions as a piezoelectric vibration device that vibrates the vibrating plate 81 by imparting flexural vibration to the piezoelectric actuator 1 through the application of an electric signal. Note that the vibrating plate 81 may be supported, at its other end in a length direction thereof (at its end pointing in the −y direction in the drawing or at its edge), by a non-illustrated support member.

The piezoelectric vibration device of the present embodiment is composed of the piezoelectric actuator 1 capable of noise reduction, and can therefore be implemented as a high-quality piezoelectric vibration device which can be driven with stability for a long period of time.

Moreover, in the piezoelectric vibration device of the present embodiment, the vibrating plate 81 is joined to the flat other main surface of the piezoelectric actuator 1. Thus, the piezoelectric vibration device can be designed so that the piezoelectric actuator 1 and the vibrating plate 81 are firmly joined to each other.

Figure 13:
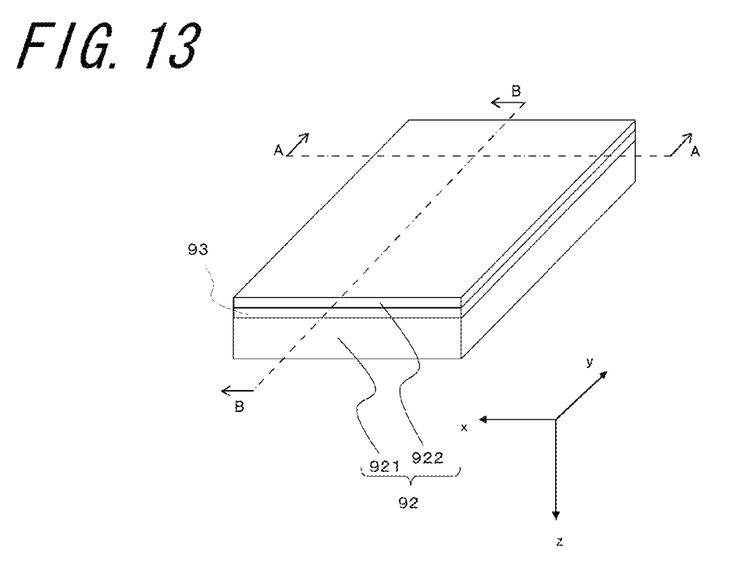
FIG. 13 is a schematic perspective view schematically showing a portable terminal according to an embodiment of the invention.
Figure 14:
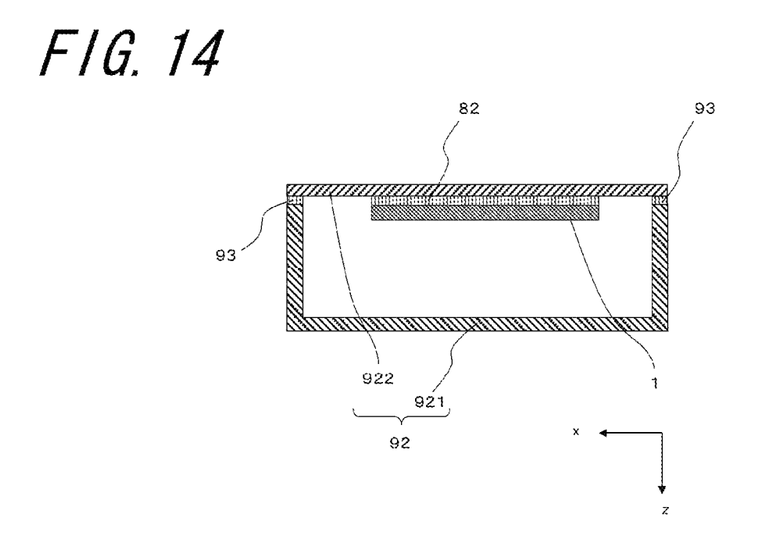
FIG. 14 is a schematic sectional view taken along the line A-A shown in FIG. 13.
Figure 15:
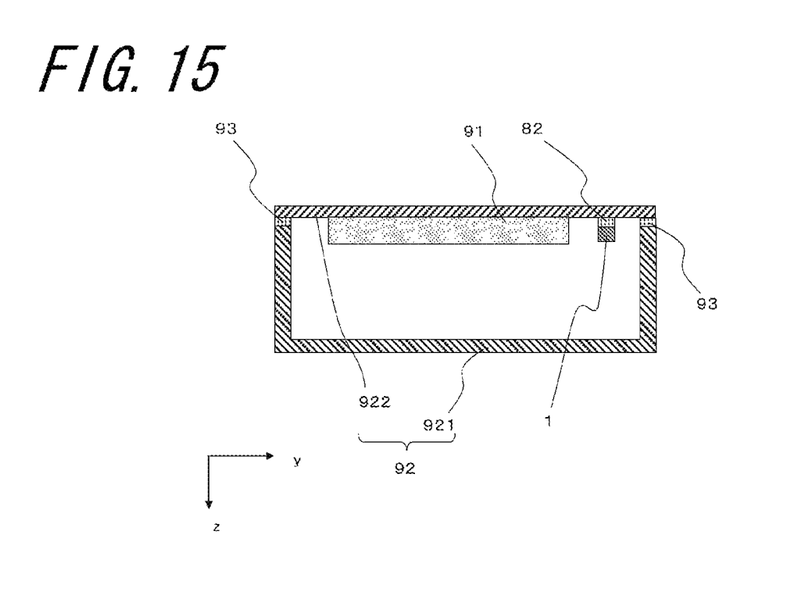
FIG. 15 is a schematic sectional view taken along the line B-B shown in FIG. 13.

As shown in FIG. 13 to FIG. 15, a portable terminal according to the invention comprises: the piezoelectric actuator 1; an electronic circuit (not shown in the drawings);

a display 91; and a housing 92, and the other main surface of the piezoelectric actuator 1 is joined to the housing 92. FIG. 13 is a schematic perspective view schematically showing the portable terminal of the invention, FIG. 14 is a schematic sectional view taken along the line A-A shown in FIG. 13, and FIG. 15 is a schematic sectional view taken along the line B-B shown in FIG. 13.

In the case of joining the piezoelectric actuator 1 and the housing 92 by the deformable joining member 82, upon transmission of vibration from the piezoelectric actuator 1, the deformable joining member 82 becomes deformed more greatly than the housing 92. The joining member 82 can be deformed when the housing 92 is vibrated by driving the piezoelectric actuator 1, and, given that the joining member 82 and the housing 92 are subjected to the same force, then the joining member 82 becomes deformed more greatly than the housing 92. Such a joining member 82 is shaped like a film, for example. Moreover, the joining member 82 is made of a material which is softer and becomes deformed more easily than the housing 92, and is thus smaller than the housing 92 in respect of coefficient of elasticity and rigidity, such as Young's modulus, modulus of rigidity, and modulus of volume elasticity.

At this time, vibration in reverse phase reflected from the housing 92 can be alleviated by the deformable joining member 82, wherefore the piezoelectric actuator 1 is capable of transmitting strong vibration to the housing 92 without incurring the influence of ambient vibration.

Particularly, it is preferable that the joining member 82, at least partly, is made of a viscoelastic body in that, while strong vibration from the piezoelectric actuator 1 can be transmitted to the housing 92, weak vibration reflected from the housing 92 can be absorbed by the joining member 82. For example, it is possible to use a double-faced tape formed by applying an adhesive to both sides of a base material made of a nonwoven fabric or the like, or a joining member composed of an adhesive having elasticity, each of which has a thickness of 10 μm to 2000 μm, for example.

In the present example, the piezoelectric actuator 1 is attached to part of the housing 92 serving as a cover of the display 91, and this part of the housing 92 functions as a vibrating plate 922.

While the present example has been described with respect to the case where the piezoelectric actuator 1 is joined to the housing 92, the piezoelectric actuator 1 may be joined to the display 91.

The housing 92 comprises a box-shaped housing main body 921 with its one surface left opened, and the vibrating plate 922 which blocks the opening of the housing main body 921. The housing 92 (the housing main body 921 and the vibrating plate 922) can be formed with preferred use of a material having high rigidity and great elasticity such as synthetic resin.

The edge of the vibrating plate 922 is attached to the housing main body 921 through a joining member 93 so as to be able to vibrate. The joining member 93 is made of a material which is softer and becomes deformed more easily than the vibrating plate 922, and is thus smaller than the vibrating plate 922 in respect of coefficient of elasticity and rigidity, such as Young's modulus, modulus of rigidity, and modulus of volume elasticity. That is, the joining member 93 is deformable, and, given that the joining member 93 and the vibrating plate 922 are subjected to the same force, then the joining member 93 becomes deformed more greatly than the vibrating plate 922.

The joining member 93 may either be of a one-piece member or of a composite body consisting of several members. As such a joining member 93, for example, a double-faced tape formed by applying an adhesive to both sides of a base material made of a nonwoven fabric or the like can be preferably used. The thickness of the joining member 93 is adjusted so as to avoid attenuation of vibration ascribable to too large a thickness, and more specifically, it is set to fall in the range of 0.1 mm to 0.6 mm, for example. However, in the portable terminal of the invention, there is no particular limitation to the material used for the joining member 93, wherefore the joining member 93 may be made of a material which is harder and less deformable than the vibrating plate 922. Moreover, under certain circumstances, the joining member 93 may be omitted from the construction.

Exemplary of the electronic circuit (not shown) are a circuit for processing image information to be shown on the display 91 and sound information to be transmitted by the portable terminal, a communication circuit, and so forth. The electronic circuit may either be of at least one of the aforementioned circuits or include all of these circuits.

Moreover, the electronic circuit may be of a circuit having different capability. Furthermore, a plurality of electronic circuits may be provided. Note that the electronic circuit and the piezoelectric actuator 1 are connected to each other by means of non-illustrated connection wiring.

The display 91 is a display device having the function of showing image information, and, a heretofore known display such for example as a liquid crystal display, a plasma display, or an organic EL display can be preferably used as the display 91. Note that the display 91 may be designed to have an input device such as a touch panel. Moreover, the cover (vibrating plate 922) of the display 91 may be designed to have an input device such as a touch panel. Furthermore, the display 91 may be, in its entirety or in part, designed to function as a vibrating plate.

Moreover, the portable terminal of the invention is characterized in that the display 91 or the housing 92 produces vibration to transmit sound information through ear cartilage or by air conduction. The portable terminal of the present example is capable of effecting transmission of sound information by transmitting vibration to ear cartilage through the direct contact of the vibrating plate (the display 91 or the housing 92) with the ear, or the contact of the vibrating plate with the ear through other object. That is, transmission of sound information can be achieved by transmitting vibration to ear cartilage through the direct or indirect contact of the vibrating plate (the display 91 or the housing 92) with the ear. Thus, for example, a portable terminal capable of sound information transmission even in a noisy environment can be obtained. Note that the object to be interposed between the vibrating plate (the display 91 or the housing 92) and the ear may be any given object so long as it is capable of transmission of vibration, for example, a cover for the portable terminal, headphones, earphones, and so forth. Moreover, the portable terminal may be designed to transmit sound information by causing sound produced from the vibrating plate (the display 91 or the housing 92) to propagate through the air. Furthermore, the portable terminal may be designed to transmit sound information via a plurality of routes.

The portable terminal of the present example transmits sound information by means of the piezoelectric actuator 1 capable of noise reduction, and is thus capable of transmission of high-quality sound information.

Concrete examples of the piezoelectric actuator of the invention will be explained.

The piezoelectric actuator was produced in the following manner.

The piezoelectric element was given a rectangular parallelepiped form which was 23.5 mm in length, 3.3 mm in width, and 0.5 mm in thickness. Moreover, the piezoelectric element was designed to have a structure consisting of 30 µm-thick piezoelectric layers and internal electrodes which were alternately laminated, and the total number of the piezoelectric layers was 16. The piezoelectric layer was made of lead zirconate titanate. A silver-palladium alloy was used for the internal electrode.

After laminating ceramic green sheets bearing a printed electrically-conductive paste composed predominantly of silver palladium, the laminate was pressurized so that the ceramic green sheets adhere tightly to each other, was subjected to degreasing treatment at a predetermined temperature, and was fired at 1000° C., whereupon a sintered stacked body was obtained.

Next, the surface electrode was obtained by printing an electrically-conductive paste composed predominantly of silver in a manner such that each widthwise end of the surface electrode is 1 mm longer than the widthwise end of the internal electrode.

A voltage having a field strength of 2 kV/ram was applied between the internal electrodes (between the first electrode and the second electrode) through the surface electrode to generate polarization of the piezoelectric element.

Moreover, the flexible substrate and the shock-absorbing material were produced in the following manner. To begin with, copper foil for forming the wiring conductor was stuck to a polyimide film in the form of a sheet bearing an arrangement of a large number of base films (a segmentable sheet for forming base films) with an adhesive. Next, a conductor pattern of the wiring conductor was formed by means of photolithography, and, in the interest of insulation and conductor protection, a polyimide film which constituted the cover film was stuck with an adhesive. Next, gold-plating treatment was performed, and, a 125 µm-thick polyimide sheet for forming the shock-absorbing material (a segmentable sheet for forming shock-absorbing materials) was stuck to the wiring conductor-free surface of the segmentable sheet for forming base films with a thermosetting resin adhesive, and the sheet laminate was punched into a predetermined shape with a die, whereupon the flexible substrate 2 and the shock-absorbing material 3 were produced. As shown in FIG. 6, the shock-absorbing material was placed so as to lie over the entire area of the first region while straddling the entire area of the boundary of the first region and the second region. Moreover, as shown in FIG. 11, the dimensions of the shock-absorbing material were determined so that the overlapping area of the shock-absorbing material and the cover film 23 measures 1 mm.

After that, an electrically-conductive adhesive containing, as conductive particles, gold-plated resin balls was applied onto the surface of the piezoelectric element to be joined to the flexible substrate.

Then, with the flexible substrate kept in contact with the piezoelectric element, heat and pressure were applied to bring the flexible substrate into conduction with the piezoelectric element, as well as to achieve mutual fixation, whereupon the piezoelectric actuator according to the example of the invention was produced. As the aforementioned electrically-conductive adhesive, an anisotropic conductive material which effects conduction in a thickness direction thereof, yet does not effect conduction in an in-plane direction thereof was used.

Meanwhile, with use of a flexible substrate free of a shock-absorbing material, a piezoelectric actuator was produced as a comparative example in the same manner as that adopted to produce the example thus far described.

Then, in each of the piezoelectric actuators, a sinusoidal signal of an effective value 1 Vrms was applied at the piezoelectric element via the flexible substrate at a frequency of 1 kHz in order to monitor impedance waveforms. As the result of the observation, the impedance waveform of the piezoelectric actuator according to the example of the invention showed no sign of noise, but the impedance waveform of the piezoelectric actuator according to the comparative example showed a sign of noise.

That is, it has been confirmed that the use of the piezoelectric actuator of the invention makes it possible to avoid transmission of vibration of the piezoelectric body to the connector junction as noise.

The following is a list of the Reference Signs List described herein:
1: Piezoelectric actuator
10: Piezoelectric element
2: Flexible substrate
201: First region
202: Second region
21: Base film
22: Wiring conductor
23: Cover film
3: Shock-absorbing material
4: Electrically-conductive joining member
41: Conductive particle
42: Resin adhesive
5: Connector
81: Vibrating plate
82: Joining member
91: Display
92: Housing
921: Housing main body
922: Vibrating plate
93: Joining member

The invention claimed is:

1. A piezoelectric actuator, comprising:
a piezoelectric element comprising a stacked body composed of internal electrodes and piezoelectric layers which are laminated, and a surface electrode disposed on one of main surfaces of the stacked body so as to be electrically connected to the internal electrodes;
a flexible substrate electrically connected to the surface electrode; and
a shock-absorbing material disposed on the flexible substrate,
the shock-absorbing material, at least partly, being disposed on a first region of the flexible substrate which overlaps with the piezoelectric element,
the shock-absorbing material being disposed so as to straddle a boundary of the first region and a second region of the flexible substrate, the second region situated so as to: extend from the piezoelectric element; and not overlap with the piezoelectric element.

2. The piezoelectric actuator according to claim 1, wherein the shock-absorbing material is disposed so as to lie over an entire area of the first region while straddling an entire area of the boundary of the first region and the second region.

3. The piezoelectric actuator according to claim 1, wherein a pair of the shock-absorbing materials is disposed so that the pair of the shock-absorbing materials is disposed so as to straddle both end portions of the boundary of the first region and the second region, respectively.

4. The piezoelectric actuator according to claim 1, wherein the flexible substrate includes a base film, a wiring conductor disposed on a main surface of the base film facing the piezoelectric element, and a cover film disposed so as to cover part of the wiring conductor, the cover film is not disposed on the first region and nearby locations, and the shock-absorbing material is disposed on a region so as to overlap with the cover film.

5. The piezoelectric actuator according to claim 1, wherein the shock-absorbing material is greater in thickness than the flexible substrate.

6. The piezoelectric actuator according to claim 1, wherein the shock-absorbing material is bonded to an upper surface of the flexible substrate via a resin adhesive.

7. A piezoelectric vibration device, comprising:
the piezoelectric actuator according to claim 1; and
a vibrating plate joined to an other main surface of the piezoelectric element.

8. The piezoelectric vibration device according to claim 7, wherein the piezoelectric actuator and the vibrating plate are joined to each other with a deformable joining member.

9. A portable terminal, comprising:
the piezoelectric actuator according to claim 1;
an electronic circuit;
a display; and
a housing, an other main surface of the piezoelectric element being joined to the display or the housing.

10. The portable terminal according to claim 9, wherein the piezoelectric element and the display or the housing are joined to each other with a deformable joining member.

11. A piezoelectric actuator, comprising:
a piezoelectric element comprising a stacked body composed of internal electrodes and piezoelectric layers which are laminated, and a surface electrode disposed on one of main surfaces of the stacked body so as to be electrically connected to the internal electrodes;
a flexible substrate electrically connected to the surface electrode; and
a shock-absorbing material disposed on the flexible substrate, the shock-absorbing material, at least partly, being disposed on a first region of the flexible substrate which overlaps with the piezoelectric element, the flexible substrate including a base film and a wiring conductor disposed on the base film, and the base film and the shock-absorbing material being made of the same material.

12. The piezoelectric actuator according to claim 11, wherein the shock-absorbing material is greater in thickness than the flexible substrate.

13. The piezoelectric actuator according to claim 11, wherein the shock-absorbing material is bonded to an upper surface of the flexible substrate via a resin adhesive.

14. A piezoelectric vibration device, comprising:
the piezoelectric actuator according to claim 11; and
a vibrating plate joined to an other main surface of the piezoelectric element.

15. The piezoelectric vibration device according to claim 14, wherein the piezoelectric actuator and the vibrating plate are joined to each other with a deformable joining member.

16. A portable terminal, comprising:
the piezoelectric actuator according to claim 11;
an electronic circuit;
a display; and
a housing, an other main surface of the piezoelectric element being joined to the display or the housing.

17. The portable terminal according to claim 16, wherein the piezoelectric element and the display or the housing are joined to each other with a deformable joining member.

* * * * *